United States Patent [19]

Teshima et al.

[11] 4,019,196
[45] Apr. 19, 1977

[54] INDICATING ELEMENT AND METHOD OF MANUFACTURING SAME

[75] Inventors: Toru Teshima, Hatano; Hoichiro Kashiwabara, Hino; Yoshinori Uchiyama, Machida, all of Japan

[73] Assignee: Stanley Electric Co., Ltd., Tokyo, Japan

[22] Filed: Oct. 24, 1975

[21] Appl. No.: 625,685

[30] Foreign Application Priority Data

Nov. 22, 1974 Japan .............. 49-134971
Feb. 25, 1975 Japan .............. 50-25852[U]
Feb. 25, 1975 Japan .............. 50-25853[U]
Feb. 25, 1975 Japan .............. 50-25854[U]

[52] U.S. Cl. .................. 357/17; 357/68; 313/500
[51] Int. Cl.$^2$ .................. H01L 33/00
[58] Field of Search .......... 357/17, 18, 68; 313/500

[56] References Cited

UNITED STATES PATENTS

| | | | |
|---|---|---|---|
| 3,641,390 | 2/1972 | Nakumura | 315/169 |
| 3,719,849 | 3/1973 | Steward | 313/109.5 |
| 3,737,704 | 6/1973 | Grenon | 313/108 D |
| 3,805,347 | 4/1974 | Collins | 29/25.13 |
| 3,806,777 | 4/1974 | Edmonds | 317/235 R |
| 3,900,864 | 8/1975 | Dapkus | 357/18 |

*Primary Examiner*—Martin H. Edlow
*Attorney, Agent, or Firm*—Flynn & Frishauf

[57] ABSTRACT

An indicating element comprises a base plate of P-type or N-type epitaxial crystals, a N-type or P-type indicating layer of diffusion or growth planarly formed on the base plate, and an electrode layer provided on the planar indicating layer and having a desired pattern thereon. The element is manufactured by forming an electrode on a rear surface of the base plate, forming the N-type or P-type planar indicating layer on an upper surface of the base plate by means of diffusion or crystal growth, and mounting on the planar indicating layer the electrode layer having the desired pattern thereon.

20 Claims, 10 Drawing Figures

INDICATING ELEMENT AND METHOD OF MANUFACTURING SAME

BACKGROUND OF THE INVENTION

The present invention relates to an indicating element for indicating a predetermined pattern such as a letter, mark, number or the like, and to a method of manufacturing said indicating element.

In the prior indicators intended to indicate a letter, mark, number or the like, there is an indicator, for example, in which a number of light sources (or pattern segments) are disposed on an identical plan and the indication is obtained by lighting only the desired light source, or in which pre-selection is made to letter, mark, number or the like to be indicated and the indication is obtained by lighting only the desired portion of the light source suitably disposed.

However, such prior art indicators are very complicated in their structures, have many processes in mass-production and therefore are high in manufacturing cost. Further, since the prior indicators have a number of light sources, it is troublesome to exchange the indicators and their drive when it becomes necessary.

SUMMARY OF THE INVENTION

To solve entirely such problems which exist with the prior indicators as described above, it is one object of the present invention to provide an indicating element which is suitable for mass-production and which is capable of being used permanently without necessitating troubles for maintenance and control of the element, and a method of manufacturing the indicating element.

It is another object of the invention to provide an indicating element utilizing a luminescent diode comprising a base plate of P-type or N-type epitaxial crystals, a N-type or P-type planar layer of the diffusion or growth type formed on the base plate, and an electrode layer provided on the planar layer and having a desired pattern thereon.

It is a further object of the invention to provide a method of manufacturing an indicating element comprising the steps of forming an electrode on a rear surface of a base plate of P-type or N-type epitaxial crystals, forming an N-type or P-type planar indicating portion on an upper surface of the base plate by means of diffusion or growth, and mounting on the planar indicating portion an electrode layer having a desired pattern.

It is another object of the invention to provide an indicating element utilizing a luminescent diode having an electrode layer and a peripheral portion of which is relatively large.

It is a further object of the invention to provide an indicating element in which indication is given on both the sides of the luminescent element.

It is a still further object of the invention to provide an indicating element in which a number of electrode layers each having an indication pattern are juxtaposed whereby each indication pattern can be optionally selected.

BRIEF DESCRIPTION OF THE DRAWINGS

The above and further objects and novel features of the invention will more fully appear from the following detailed description when the same is read in connection with the accompanying drawings. It is to be expressly understood, however, that the drawings are for purpose of illustration only and is not intended as a definition of the limits of the invention.

In the drawings.

DETAILED DESCRIPTION OF THE EMBODIMENTS

Figure 1:
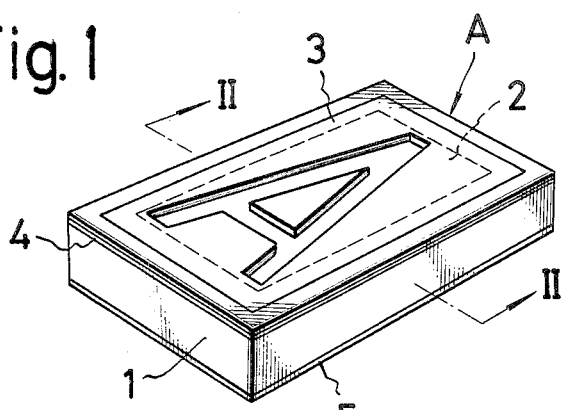
FIG. 1 is a perspective view of an indicating element in accordance with the present invention.

In FIG. 1, an indicating element includes a base plate 1 of, for example, P-type epitaxial crystals of GaAsP, GaP, GaAsAl or the like. An electrode layer 3 has, in this embodiment, a punched pattern A of the alphabet. Accordingly, when electric current is passed into the indicating element in a manner as described hereinafter, luminescence causes only a portion A formed on the electrode layer 3 to luminesce so as to obtain an indication. Of course, the pattern formed on the electrode layer 3, may be freely changed, thereby obtaining various desired indications. Throughout the present specification, the terms "indicating element" and "displaying device" will be used synonomously.

The detailed structure will be next explained with reference to a sectional view shown in FIG. 2. On the base plate 1 formed by the P-type epitaxial growth as previously described is disposed a planar layer 2 formed by diffusion of an impurity or by liquid phase growth, the layer being made planarly to diffuse or grow on a surface of the crystal base plate 1. By forming such a layer 2, a luminescent diode is constituted, which can produce a planar luminescence from a whole region of the surface of the layer 2. At the junctions between the diffusion layer 2 and the base plate 1 is a protective film 4 and an electrode 5 is provided on a rear surface of the crystal base plate 1. Electrode mask layer 3 is provided over the layer 2 with the pattern A formed thereby.

The indicating element is manufactured by forming the base plate 1 with epitaxial growth, forming the planar layer, that is, the luminescent indicating portion on an upper surface of the base plate by means of diffusion or gas phase or liquid phase growth, and mounting entirely on the diffusion or growth layer the electrode layer having the desired pattern, whereby luminescence is obtained from the pattern portion. Therefore, the manufacture is very simple.

In the above structure, when electric current is passed between the electrode layer 3 and the electrode 5, the luminescence of the pattern masked by the electrode layer 3 is intercepted and indication of the character A is obtained in this embodiment.

As mentioned above, the indicating element in accordance with the present invention is constituted by forming a light emitting diode in which a planar luminescence is obtained by semiconductor crystals comprised of, for example, GaAsP, GaP, GaAsAl or the like, and masking the luminescent surface with an electrode layer having a desired pattern, whereby the indicating element is effected to obtain indication of a desired letter, mark, number or the like by intercepting the luminescence of the unnecessary portion. Accordingly, the indicating element enables its permanent use and does not entirely necessitate any trouble in its maintenance and control.

Also, since the desired letter, mark, number or the like can be indicated merely by changing the pattern of the electrode layer, the indicating layer can be mass-produced by pre-manufacturing a luminescent diode to be capable of obtaining a planar indication and by disposing an electrode layer having a desired pattern thereon, thereby simplifying the manufacturing process. Further, the manufacturing techniques of the indicating element is similar to that to manufacture the conventional luminescent diode and consequently the indicating element is further suitable for mass-production. In this specification, the term "luminescent diode" is used synonomously with the term "light emitting diode."

Figure 2:
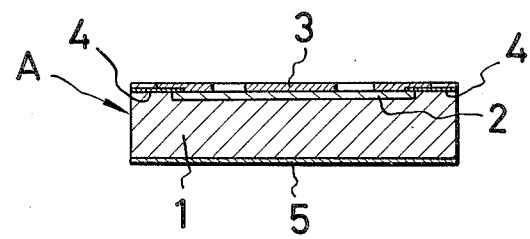
FIG. 2 is a sectional view taken on line II — II in FIG. 1.
Figure 3:
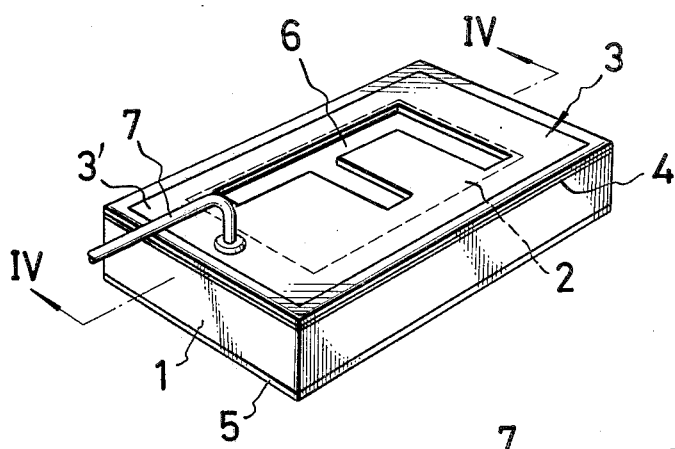
FIG. 3 is a perspective view of another embodiment of an indicating element according to the invention.
Figure 4:
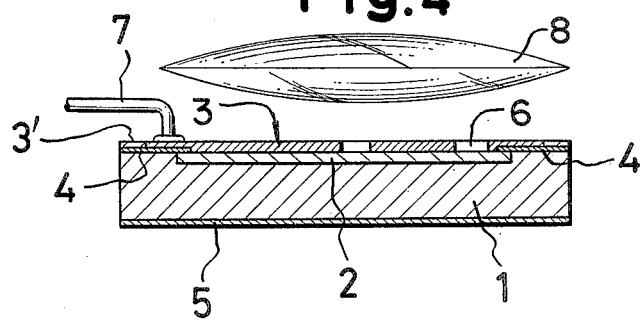
FIG. 4 is a longitudinal sectional view taken on line IV — IV in FIG. 3.

Referring next to FIGS. 3 and 4, in this embodiment, a peripheral portion 3' of an electrode layer 3 is formed to have a relatively large dimension as compared with the peripheral portion of the display device shown in FIGS. 1 and 2. In the indicating element shown in FIG. 1 though a wire must be bonded in position as shown in FIGS. 3 and 4, misbonding may occur in the case of a small sized indicating element whereby it may have defects which can adversely affect the indicating function and which may damage the electrode layer upon amending any such misbonding.

However, when the indicating element has relatively large peripheral portions of the electrode layer (FIGS. 3 and 4), it is easy to bond a wire 7 as compared with the indicating element shown in FIGS. 1 and 2. Further, if misbonding were to occur re-bonding may easily be carried out at another proper portion on the peripheral portion whereby the electrode layer is protected from damage.

Further, since the pattern can be enlarged by disposing a lens 8 (FIG. 4) in front of the pattern 6 in a suitable manner, the indicating element may have a relatively small size itself.

Figure 5:
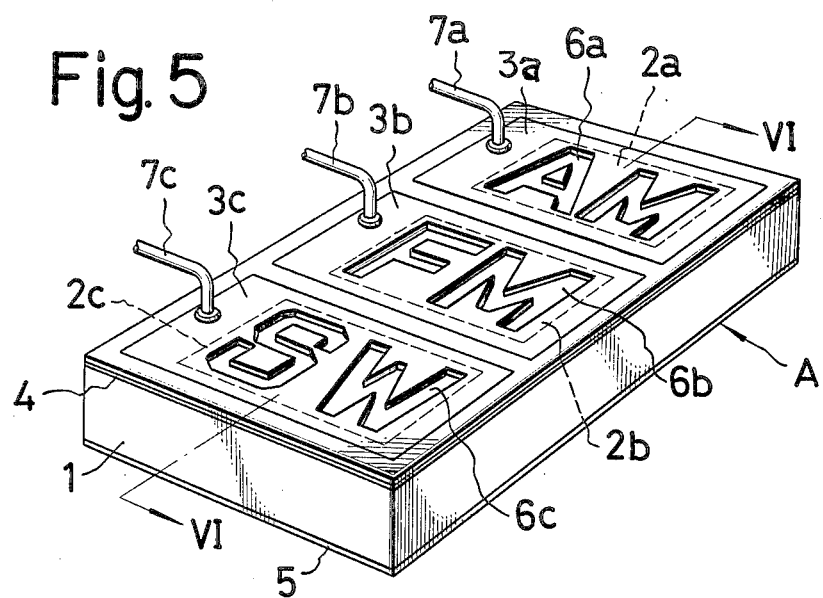
FIG. 5 is a perspective view showing a further embodiment of an indicating element according to the invention.
Figure 6:
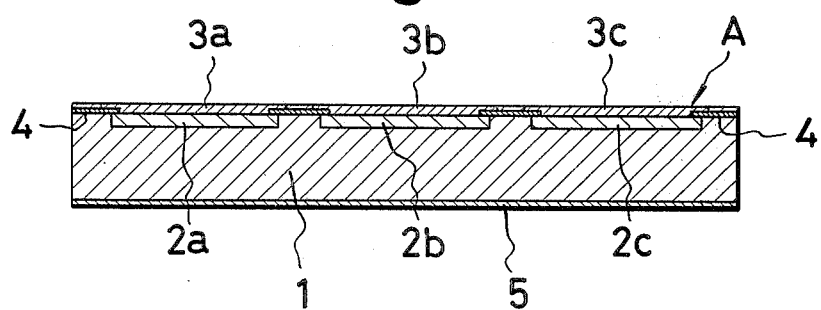
FIG. 6 is a longitudinal sectional view taken on line VI — VI in FIG. 5.

In FIGS. 5 and 6, a number of electrode layers each forming an indicating pattern are juxtaposed on a single element. Each pattern has its own lead 7a, 7b, 7c so as to optionally select and indicate each indicating pattern.

In FIGS. 5 and 6 reference mark A denotes a light emitting diode in which a number of diffusion layers 2a, 2b and 2c are planarly juxtaposed on an upper surface of a base plate 1 at a suitable distance and a single electrode 5 is formed on a rear surface. On electrode layers 3a, 3b and 3c are formed patterns 6a, 6b and 6c (AM, FM, SW in this embodiment) to be indicated by means of, for example, punching. These electrode layers 3a, 3b and 3c are fixed to correspond to the diffusion layers 2a, 2b and 2c on the surface of the latter with vaporization and wires 7a, 7b and 7c are bonded on each electrode layer, respectively. Further, reference numeral 4 denotes a protective film to protect the junction between the diffusion layers 2a, 2b and 2c, and the base plate 1, as shown in FIG. 1.

In the embodiment of FIGS. 5 and 6, when electric current is passed to the luminescent diode through the wire 7a a planar luminescence is obtained from the diffusion layer 2a associated with the electrode layer 3a. This luminescence, however, is intercepted because the diffusion layer 2a is masked by the electrode layer 3a and the light is emitted from only the pattern area 6a is formed by punching on the electrode layer 3a. As a result, the pattern 6a, that is, letters AM of the alphabet is indicated. In the same manner as this, when electric current is passed to the luminescent diode A through the wire 7b and/or the wire 7c, the pattern 6b formed on the electrode layer 3b and/or the pattern 6c formed on the electrode layer 3c can be indicated.

In this case, if the wires are suitably selected, three indication patterns 6a, 6b and 6c can be indicated at the same time, or two or more patterns among them.

The indicating element of FIGS. 5 and 6, since a plurality of indication patterns are provided on one element, can be manufactured at low cost. Further, there is an advantage that it is easy to manufacture because the indicating element can eliminate additional components which combine or join a plurality of luminescent elements, as would be required with prior art displays. Furthermore, it contributes to miniaturization of the displaying device since a plurality of indications are possible in a very limited space on one element.

The above described indicating elements shown in FIGS. 1 to 6 are constructed such that the indication is effected only on a surface on which the pattern is mounted.

The following embodiments are of an indicating element which is formed to enable indications of both surfaces with one luminescent element.

Figure 7:
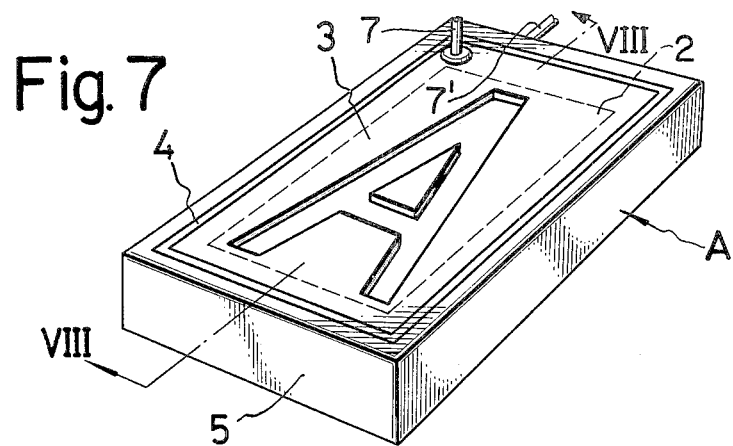
FIG. 7 is a perspective view showing another embodiment of an indicating element in accordance with the invention.
Figure 8:
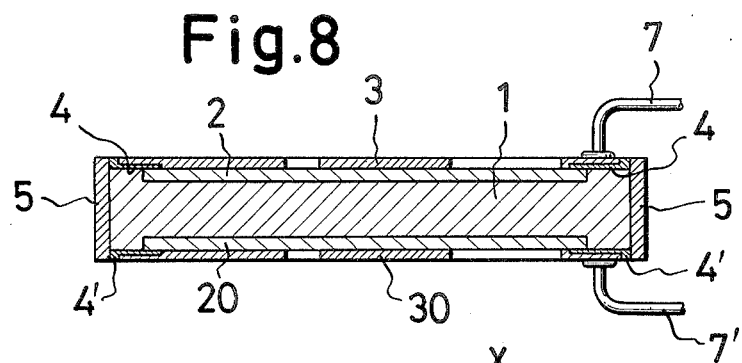
FIG. 8 is a longitudinal sectional view taken on line VIII — VIII in FIG. 7.

Referring first to FIGS. 7 and 8, a luminescent diode A comprises diffusion layers 2 and 20 planarly provided on both surfaces of a base plate 1 and electrode plates 5 mounted on end surfaces of the base plate 1.

Indicated by reference numerals 3 and 30 are electrode layers each formed by punching a pattern (letter A of the alphabet in the embodiment shown) which is to be indicated. The electrode layers 3 and 30 are fixed on the surfaces of the diffusion layers 2 and 20 by vaporization or the like, thereby masking the diffusion layers 2 and 20. Wires 7 and 7' are disposed at suitable positions on the electrode layers 3 and 30, respectively. Reference numerals 4 and 4' are protective films for protecting junctions between the base plate 1 and the diffusion layers 2 and 20, as in the other embodiments previously described.

When electric current is passed across the above luminescent diode, a planar luminescence is obtained on the diffusion layer 2 and 20. However, because the diffusion layers 2 and 20 are being masked by the electrode layers 3 and 20, a beam of light is intercepted and emitted outwardly from only the portion of the punched out pattern formed by punching whereby the letter A of the alphabet is indicated on both the surfaces.

Figure 9:
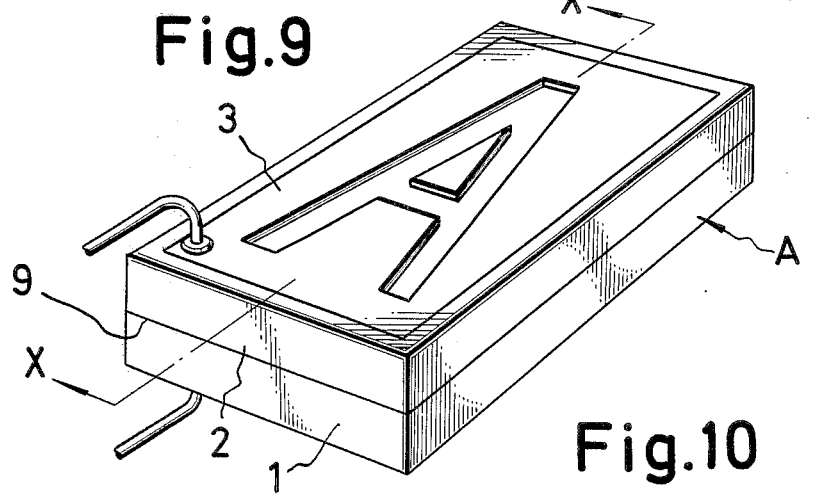
FIG. 9 is a perspective view showing a further embodiment of an indicating element in accordance with the invention.
Figure 10:
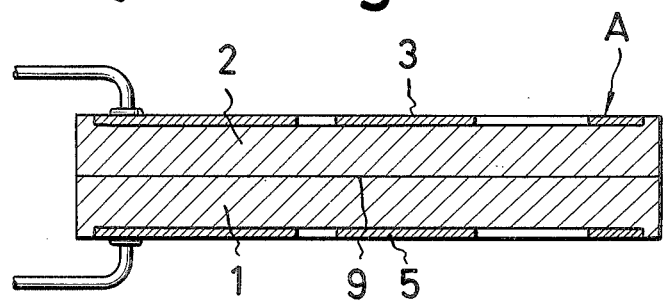
FIG. 10 is a longitudinal sectional view taken on line X — X in FIG. 9.

In another embodiment shown in FIGS. 9 and 10, a luminescent diode A has a structure which joins on a transparent base plate 1 a diffusion layer 2 on a surface of which is disposed an electrode layer 3 forming an indication pattern. An electrode plate 5 forming an indication pattern is disposed on a rear surface of the base plate 1. Although the diffusion layer 2 is provided on only one surface of the base plate 1 according to this structure, the light from the joining surface 9 between the diffusion layer 2 and the base plate 1 reaches up to the rear side of the base plate 1 because of transparent character of the latter. Since the rear side of the base plate 1, as previously described, is masked by the electrode plate 5 forming the indication pattern, the light is emitted from only the portion of the pattern formed by electrode plate 5 and the pattern is indicated. Of course, the indication of the pattern on the electrode layer 3 is obtained on the front side of the diffusion layer 2 as in the case of the previously described embodiments.

Further, the embodiment shown in FIGS. 7 and 8 is convenient since in addition to the simultaneous indication of the patterns on both the surfaces, only one surface can be indicated by selecting one of the wires 7 or 7', if necessary. Furthermore, it is arbitrary that the both surfaces have identical or different patterns and therefore it can use for various services. The indicating element has further features that result in a low cost because the indication of both surfaces can be realized on one element which can be made very thin.

While the described embodiments represent the preferred forms of the present invention, it is to be understood that modifications will occur to those skilled in that art without departing from the spirit of the invention. The scope of the invention is therefore to be determined solely by the appended claims.

What is claimed is:

1. An indicating element comprising:
   a semiconductor base plate (1) of epitaxial crystals of a first conductivity type;
   a first electrode (5) on a surface of said base plate;
   a planar semiconductor layer (2) of a second conductivity type opposite to that of said first conductivity type embedded in an opposite surface of said base plate (1), an exposed junction being defined therebetween, said base plate (1) and said planar layer (2) forming a luminescent diode;
   a protective layer (4) over the exposed junction between said base plate (1) and planar (2); and
   an electrode mask layer (3) provided on said planar layer (2), base plate (1) and protective layer (4) and defining a predetermined indicating pattern, said electrode mask layer having light blocking portions over a substantial surface portion of said planar layer (2) and void portions, said void portions defining said predetermined pattern;
   whereby when electric power is applied across said first electrode (5) and electrode mask layer (3) light is emitted from said luminescent diode and is blocked by said light blocking portions of said electrode mask layer (3) and is passed through said void portion to display said predetermined pattern.

2. An indicating element according to claim 1, wherein said electrode mask layer (3) has a large peripheral portion (3' — FIGS. 3 and 4) around said planar layer (2) and over said protective layer (4) such that errors in bonding an electrode thereto over said protective layer do not damage the portion of said electrode mask layer defining said indicating pattern, and comprising an electrical conductor bonded on said peripheral portion.

3. An indicating element according to claim 1, including a plurality of electrode mask layers on said planar layer, each electrode mask layer having light blocking portions defining a respective predetermined indicating pattern.

4. An indicating element according to claim 1, including two of said planar layers provided on respective opposite sides of said base plate; and respective protective layers over the exposed junction portions between said base plate and said planar layers, whereby the indication is performed on both opposite surfaces of the indicating element.

5. An indicating element according to claim 1, wherein said semiconductor base plate comprises transparent material and said first electrode comprises a further electrode mask layer disposed on the surface of said base plate opposite to the surface on which said planar layer is disposed, said further electrode mask layer having light blocking portions defining a predetermined pattern, whereby the indication is obtained on two surfaces of the indicating element.

6. An indicating element according to claim 1, wherein said first conductivity type is P-type and said second conductivity type is N-type.

7. An indicating element according to claim 1, wherein said first conductivity type is N-type and said second conductivity type is P-type.

8. An indicating element according to claim 1, wherein said planar layer is a diffusion layer formed in said base plate.

9. An indicating element according to claim 1, wherein said planar layer is a growth layer formed in said base plate.

10. An indicating element according to claim 3, further comprising means for selecting at least one of said indicating patterns of said plurality of electrode layers.

11. An indicating element according to claim 10, wherein said selecting means comprises respective electrodes coupled to said plurality of electrode layers which are adapted to be optionally selected to provide indication of their respective indicating patterns.

12. An indicating element according to claim 1, wherein said first electrode is disposed on the rear surface of said base plate which is opposite to the surface of which said planar layer is provided.

13. An indicating element according to claim 4, wherein said first electrode is provided on an edge surface of said base plate.

14. An indicating element according to claim 13, wherein said first electrode is provided around the complete periphery of said base plate.

15. An indicating element according to claim 4, comprising respective electrode mask layers provided on said planar layers, said respective electrode mask layers having respective light blocking portions defining respective predetermined indicating patterns.

16. An indicating element according to claim 15, wherein said predetermined indicating patterns are different patterns.

17. An indicating element according to claim 5, wherein said predetermined patterns defined by said electrode mask layer and by said further electrode mask layer are different patterns.

18. An indicating element according to claim 5 further comprising respective electrodes connected to peripheral portions of said electrode mask layers for application of electric power to said luminescent diode.

19. An indicating element according to claim 1 further comprising an electrode (7) connected to said electrode mask layer (3) over a portion of said protective layer (4).

20. An indicating element comprising:
- a transparent semi-conductor base plate (1) of a first conductivity type;
- a second semiconductor layer (2) of a second conductivity type opposite to that of said first conductivity type disposed on said transparent base plate (1), said base plate (1) and second semiconductor layer forming a luminescent diode;
- a first electrode mask layer (3) provided on said second layer (2), said first electrode mask layer having light blocking portions over a substantial portion of said second layer (2) which define a predetermined indicating pattern, said first electrode mask layer having void portions over the area of said indicating pattern;
- a second electrode mask layer (5) on a surface of said base plate opposite the junction between said base plate and said second layer, said second electrode mask layer (5) having light blocking portions over a substantial portion of said base plate (1) which define a second predetermined indicating pattern, said electrode mask layer having void portions over the area of said second indicating pattern;
- whereby when electric power is applied across said first and second electrode mask layers light is emitted from said luminescent diode and is blocked by said light blocking portions of said electrode mask layers and is passed through void portions thereof to display said predetermined patterns.

* * * * *